US012777584B2

(12) United States Patent
Lemieux et al.

(10) Patent No.: US 12,777,584 B2
(45) Date of Patent: Oct. 27, 2026

(54) CONDUCTIVE MATERIALS AND THEIR METHODS OF PREPARATION BY METALLIZATION WITH METAL COMPLEX CONDUCTIVE INK COMPOSITIONS

(71) Applicant: ELECTRONINKS INCORPORATED, Austin, TX (US)

(72) Inventors: Melburne C. Lemieux, El Dorado Hills, CA (US); Steven Brett Walker, Austin, TX (US); Gaurav Tulsyan, Austin, TX (US)

(73) Assignee: ELECTRONINKS INCORPORATED, Austin, TX (US)

( * ) Notice: Subject to any disclaimer, the term of this patent is extended or adjusted under 35 U.S.C. 154(b) by 644 days.

(21) Appl. No.: 17/265,626

(22) PCT Filed: Aug. 3, 2019

(86) PCT No.: PCT/US2019/045024
§ 371 (c)(1),
(2) Date: Feb. 3, 2021

(87) PCT Pub. No.: WO2020/028891
PCT Pub. Date: Feb. 6, 2020

(65) Prior Publication Data

US 2021/0307163 A1 Sep. 30, 2021

Related U.S. Application Data

(60) Provisional application No. 62/714,641, filed on Aug. 3, 2018.

(51) Int. Cl.
*H05K 1/03* (2006.01)
*C09D 11/30* (2014.01)
(Continued)

(52) U.S. Cl.
CPC ............. *H05K 1/038* (2013.01); *C09D 11/30* (2013.01); *C09D 11/52* (2013.01); *D06M 11/83* (2013.01);
(Continued)

(58) Field of Classification Search
None
See application file for complete search history.

(56) References Cited

U.S. PATENT DOCUMENTS 940,151 A * 11/1909 Heath
2,474,502 A * 6/1949 Suchy .................... D06M 11/83 205/159
(Continued)

FOREIGN PATENT DOCUMENTS

CN 103061114 A 4/2013
CN 103554530 A 2/2014
(Continued)

OTHER PUBLICATIONS

Fujita—JP 2000-239932 A—JP D7—MT—yarn w-silver layer—2000 (Year: 2000).*
(Continued)

*Primary Examiner* — John Vincent Lawler
(74) *Attorney, Agent, or Firm* — David A. Roise; VLP Law Group LLP

(57) ABSTRACT

This disclosure provides electrically conductive materials, including electrically conductive textile materials, such as woven or knitted fabric textiles, individual fibers, and woven fibers and yarns. The conductive materials comprise a substrate material, such as a textile or other suitable material, and a metal embedded in the substrate material, in particular where the metal is embedded into and below the surface of the material. Also provided are methods of making the electrically conductive materials.

9 Claims, 7 Drawing Sheets

(51) Int. Cl.

| | |
|---|---|
| ***C09D 11/52*** | (2014.01) |
| ***D06M 11/83*** | (2006.01) |
| ***D06P 5/30*** | (2006.01) |
| ***H01B 1/22*** | (2006.01) |

(52) U.S. Cl.
CPC .................. *D06P 5/30* (2013.01); *H01B 1/22* (2013.01); *H05K 2201/0281* (2013.01)

(56) References Cited

U.S. PATENT DOCUMENTS

| | | | | |
|---|---|---|---|---|
| 2,669,646 | A * | 2/1954 | Ford | H05B 3/688 338/254 |
| 4,634,805 | A * | 1/1987 | Orban | D06M 11/83 428/394 |
| 5,968,854 | A * | 10/1999 | Akopian | D06M 11/83 428/375 |
| 6,228,922 | B1 * | 5/2001 | Wang | D06M 11/83 524/439 |
| 2005/0037057 | A1 | 2/2005 | Schuette et al. | |
| 2006/0000034 | A1 | 1/2006 | McGrath | |
| 2007/0298666 | A1 * | 12/2007 | Kurth | D04B 1/123 442/1 |
| 2011/0003153 | A1 * | 1/2011 | Chung | D06M 11/83 427/125 |
| 2014/0027038 | A1 * | 1/2014 | Lee | D06M 13/144 156/60 |
| 2014/0191211 | A1 * | 7/2014 | Chabrecek | H01L 31/0224 257/431 |
| 2016/0007475 | A1 | 1/2016 | Zanesi | |
| 2016/0358849 | A1 * | 12/2016 | Jur | H05K 1/0283 |
| 2018/0208790 | A1 * | 7/2018 | McCullough | H05K 1/092 |
| 2019/0062511 | A1 * | 2/2019 | Kurokawa | C08J 5/248 |

FOREIGN PATENT DOCUMENTS

| | | | | |
|---|---|---|---|---|
| CN | 107268214 | A * | 10/2017 | D06B 15/00 |
| CN | 107533289 | A | 1/2018 | |
| JP | 2000/239932 | * | 9/2000 | D02G 3/04 |
| JP | 2003179061 | A | 6/2003 | |
| JP | 2018080417 | A | 5/2018 | |
| JP | 2018090881 | A | 6/2018 | |
| WO | WO-2015160938 | A1 * | 10/2015 | C09D 11/52 |
| WO | 2016198969 | A1 | 12/2016 | |
| WO | 2017179666 | A1 | 10/2017 | |
| WO | 2018118460 | A1 | 6/2018 | |
| WO | 2019028435 | A1 | 2/2019 | |
| WO | 2019028436 | A1 | 2/2019 | |

OTHER PUBLICATIONS

Muralidhara—PCT D2—thermal degradation kinetics polyester+ cotton—2010 (Year: 2010).*
Lv—Recycling of waste nylon-spandex fabrics—Comp.B—2015 (Year: 2015).*
Cheng—conductive & stretchable circuits from cotton yarns & silver nanowires—2015 (Year: 2015).*
Atwa—Silver nanowire threads for conductive textiles—J. Mat. Chem.C—2015 (Year: 2015).*
Ashayer-Soltani-et-al—fabrication-conductive-stretchable-textile-w-silver-nanoparticles—2016 (Year: 2016).*
Yuan—CN 107268214 A—MT—silver-infused fabric—2017 (Year: 2017).*
Campbell—cotton fabric—silver organometallic compound—Mater. Res. Express—2017 (Year: 2017).*
Stempien—inkjet silver conductive fabric—Sensor & Actuat.—2016 (Year: 2016).*
Liu et al. (2018) RSC Adv. 8:2804.

* cited by examiner

Sample ID
083117-15

Sample ID
083117-16

| Sample ID | Macroscopic Image | Microscopic Image |
|---|---|---|
| B1 |  | |
| C1 |  | |
| D1 |  | |
| E1 |  | |
| F1 |  | |
| H1 |  |  |
| I1 |  | |

| Sample ID | Macroscopic Image | Microscopic Image |
|---|---|---|
| A2 |  |  |
| B2 |  | |
| C2 |  | |
| D2 |  | |
| E2 |  | |

| Sample ID | Microscopic Images |
|---|---|
| A3 |   |
| D3 |   |

CONDUCTIVE MATERIALS AND THEIR METHODS OF PREPARATION BY METALLIZATION WITH METAL COMPLEX CONDUCTIVE INK COMPOSITIONS

CROSS-REFERENCE TO RELATED APPLICATIONS

This application is a national phase application of PCT International Application No. PCT/US2019/045024, filed on Aug. 3, 2019, which claims the benefit of U.S. Provisional Application No. 62/714,641, filed on Aug. 3, 2018, the disclosures of which are each-is incorporated herein by reference in their entireties.

FIELD OF THE INVENTION

The present disclosure relates to novel conductive materials and their methods of preparation by metallization of substrate materials, such as textile substrate materials, with metal complex conductive ink compositions.

BACKGROUND OF THE INVENTION

Conductive textiles, fabrics, and other types of materials with suitable electrical and mechanical properties have long been sought. In particular, the applications for conductive textiles are important and numerous, including uses in electronic apparel and skin patches (i.e., wearable applications), EMI/RF shielding, interconnects, and wires. Key metrics of relevance to these materials are performance, aesthetics, safety, and cost. With respect to performance, the conductive textile or fabric preferably has high conductivity, and more importantly, is capable of maintaining a sufficient level of conductivity upon dynamic stretching and straining for thousands of cycles. Aesthetics of the conductive materials are also important. Ideally, fabrics and fibers prepared from these materials should feel as similar as possible to their unmodified forms, rather than like metallic patches or strands. Safety and lack of toxicity are likewise of importance, since many of these applications involve wearables for consumer and medical devices. Finally, low cost, which is also related to manufacturability, is critical for high-volume consumer electronic applications that utilize such materials.

Known e-textile and fabric materials traditionally consist of a metal conductive layer either surrounding a fiber (which may subsequently be woven into a yarn) or layered on top of a fabric. See, e.g., FIG. 1. Such materials are typically prepared by depositing (e.g., using common printing techniques, such as inkjet, screen printing, or the like) or sputtering a pure metal film onto the fiber or fabric. Since the metals applied by these techniques cannot penetrate the surface of the treated material, the conductive portion of the material is inherently separate from underlying fiber or fabric substrate.

Key commercial issues of textiles with a sputtered metallization layer is that the process is expensive and has low throughput. Moreover, the resulting metal layer is brittle, preventing the combination of intrinsic conductivity of the material while retaining the ability of the material to stretch/strain.

On the other hand, while being relatively more cost-effective, key commercial issues of textiles and fabrics with a deposited metal particle/polymer film top layer is poor conductivity due in part because of the low curing temperature required for fabric/textile substrates due to their temperature sensitivity.

In both cases, the composition and structure of the conductive textiles is limited to a top layer of metallization with standard particle-based metal inks and the like. This limits the mechanical and stretchable properties of the materials. In other words, conductive fabrics or fibers on the market with the metal coated predominantly only on the surface will result in peeling or fracturing off during mechanical strain, flexing, or stretching, resulting in a large increase in electrical resistance. This makes current conductive fabrics and fibers unsuitable for commercial purposes.

Metal-containing fabrics, in particular silver-containing fabrics, have been reported to have antimicrobial properties. See, e.g., U.S. Patent Application Publication No. 2005/0037057 A1. The silver in these fabrics is topically applied to the fabric in ionic form in order to provide for the controlled release of silver ions from the fabric through repeated wash cycles. The silver-treated fabrics are, however, non-conductive.

SUMMARY OF THE INVENTION

Provided herein are conductive materials, such as conductive textile materials, and their methods of preparation by metallization with metal complex conductive ink compositions.

In one aspect, the disclosure provides electrically conductive materials comprising a substrate material and a metal embedded in the substrate material, wherein the metal is embedded into and below the surface of the material.

More specifically, in some of the electrically conductive materials of the disclosure, the substrate material is a textile substrate material, such as a fabric, a fiber, a yarn, or a thread. Even more specifically, the fabric, the fiber, the yarn, or the thread comprises a polyester, a polyether-polyurea copolymer, a nylon, an acrylic, a modified cellulose, a polyvinyl alcohol, a polyvinyl chloride, a polyurethane, a cotton, a wool, a linen, or a silk material.

In some embodiments, the substrate material is a heat-degradable substrate material, for example where the substrate material is degradable at temperatures above about 300° C.

In some embodiments of the electrically conductive material, the metal comprises silver, copper, gold, palladium, platinum, or alloys or combinations of any of these metals, more specifically where the metal comprises an alloy or combination of silver, copper, gold, palladium, or platinum, or where the metal comprises silver.

Also provided in another aspect are electrically conductive materials, wherein the material is prepared by the treatment of a substrate material, such as a textile substrate material, with a metal complex conductive ink composition.

In specific embodiments, the substrate material is a textile substrate material, such as a fabric, a fiber, a yarn, or a thread, and more specifically where the fabric, the fiber, the yarn, or the thread comprises a polyester, a polyether-polyurea copolymer, a nylon, an acrylic, a modified cellulose, a polyvinyl alcohol, a polyvinyl chloride, a polyurethane, a cotton, a wool, a linen, or a silk material. In other specific embodiments, the substrate material is a heat-degradable material such as a substrate material that is degradable at temperatures above about 300° C.

In some embodiments, the metal complex conductive ink composition comprises silver, copper, gold, palladium, or platinum. More specifically, the metal complex conductive ink composition comprises a combination of silver, copper, gold, palladium, or platinum, or the metal complex conductive ink composition comprises silver.

In some embodiments, the treatment is performed at a temperature of 300° C. or lower. In some embodiments, the substrate material is treated with the metal complex conductive ink composition by dyeing, and in other embodiments the substrate material is treated with the metal complex conductive ink composition by printing.

In any of the above embodiments, the electrically conductive material may display an electrical resistance of about 1,000 ohms or less after being stretched by at least about 10%. More specifically, the material may display an electrical resistance of about 1,000 ohms or less after being stretched by at least about 10% for at least about 100 cycles.

In yet another aspect, the disclosure provides methods of preparing an electrically conductive material, comprising providing a substrate material, such as a textile substrate material, treating the substrate material with a metal complex conductive ink composition, and curing the treated substrate material to generate a metal embedded in the substrate material.

In specific embodiments, the substrate material is a textile substrate material, such as a fabric, a fiber, a yarn, or a thread, and more specifically where the fabric, the fiber, the yarn, or the thread comprises a polyester, a polyether-polyurea copolymer, a nylon, an acrylic, a modified cellulose, a polyvinyl alcohol, a polyvinyl chloride, a polyurethane, a cotton, a wool, a linen, or a silk material.

In some of these embodiments, the substrate material is a heat-degradable material, for example a substrate material that is degradable at temperatures above about 300° C.

In some method embodiments, the metal complex conductive ink composition comprises silver, copper, gold, palladium, or platinum. More specifically, the metal complex conductive ink composition comprises a combination of silver, copper, gold, palladium, or platinum or the metal complex conductive ink composition comprises silver.

In some method embodiments, the substrate material is treated with the metal complex conductive ink composition by dyeing or by printing. In some embodiments, the substrate material is treated with the metal complex conductive ink composition at least two times.

In some method embodiments, the curing step is performed at no more than about 300° C., and in some method embodiments, the curing step is performed for no more than about 120 minutes.

DETAILED DESCRIPTION OF THE INVENTION

Electrically Conductive Materials

Figure 1:
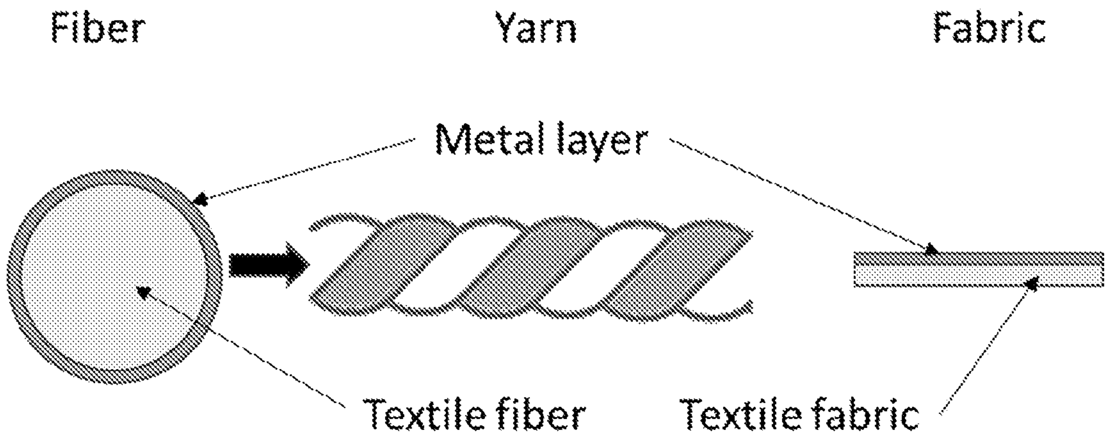
FIG. 1. Schematic of a conventional e-textile or e-fabric prepared using known methods.
Figure 2:
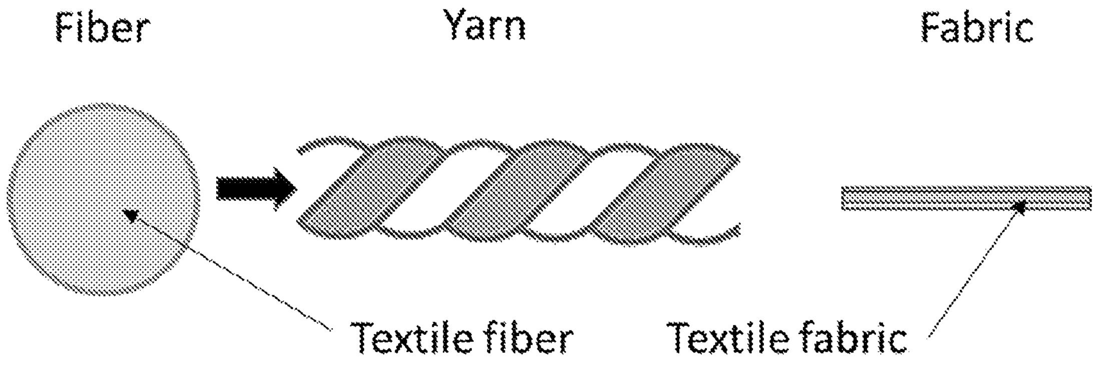
FIG. 2. Schematic of novel approach to e-textiles and e-fabrics where the metal is absorbed into the surface and/or within the textile beneath the surface to varying degrees (depth).

Provided herein are electrically conductive materials, including textiles and other materials, that comprise an embedded metal. In these conductive materials, the metal is typically present both as a very thin layer at the surface of the material, as well as being absorbed below the surface of the material (see FIG. 2). The disclosure thus provides intrinsically conductive materials, such as textiles, fibers, and other materials, with desirable electrical and mechanical properties.

The electrically conductive materials are typically prepared by the metallization of substrate materials, in particular textile substrate materials and other materials capable of absorbing applied liquids, with metal complex conductive inks. The ink compositions, which are preferably particle-free ink compositions, are absorbed by the substrate materials, so that the ink penetrates the surface of the material. Once the substrate material has been appropriately saturated with the ink, a "curing" or "drying" process is initiated, which results in a pure metal absorbed/embedded in and on the substrate material.

Conductive metal inks have previously been used in the preparation of surface-coated flexible conductive materials. For example, such inks have been developed in the last several decades as cost-effective alternatives to metal deposition in vacuum (e.g., atomic layer deposition (ALD), chemical vapor deposition (CVD), sputtering, and the like) or electroplating, due to the fact that they can be processed in ambient conditions. They have been used in numerous applications to metalize various substrates in the fields of printed electronics and semiconductors, including rigid substrates such as glass and silicon, flexible substrates such as plastic and elastomers, and more recently fabric or textile substrates. Key metrics for an ink's utility in these applications include electrical conductivity, reliability, and cost. The vast majority of conductive inks known in the literature are based on the dispersion of metal particles by organic vehicles, such as polymers or surfactants. For example, common conductive ink particles are provided as nanoparticles, flakes or platelets, and nanowires.

By comparison, the conductive ink compositions used in the preparation of the instant conductive materials are preferably particle-free metal complex ink compositions. Such inks have been developed, for example, by Electroninks, Inc. (Austin, TX). The particle-free metal complex ink compositions display highly useful properties for the purpose of preparing textile and other materials with an embedded conductive composition and structure. Importantly, the particle-free ink compositions enable saturation of a suitable substrate material, ideally a material capable of absorbing the ink, such as a textile substrate material, prior to curing of the ink at low temperature to generate the conductive metal and thus the conductive material.

In some embodiments, a silver complex ink composition is used to prepare the instant conductive materials, but other possible metal complex ink compositions likewise find utility for these preparations. For example, particle-free ink compositions comprising gold, copper, palladium, platinum, or combinations of these metals are also known. Exemplary formulations for the particle-free metal complex inks of use in the instant disclosure are described in PCT International Publication No. WO2015/160938A1 ("Conductive Ink Compositions"), PCT International Publication No. WO2018/118460A1 ("Copper Based Conductive Ink Composition And Method Of Making The Same"), U.S. Patent Application No. 62/540,829 ("Conductive Ink Compositions Comprising Palladium And Methods For Making The Same", filed Aug. 3, 2017), PCT International Publication No. WO2019/028435A1 ("Conductive Ink Compositions Comprising Palladium And Methods For Making The Same"), U.S. Patent Application No. 62/540,903 ("Conductive Ink Compositions Comprising Gold And Methods For Making The Same", filed Aug. 3, 2017), and PCT International Publication No. WO2019/028436A1 ("Conductive Ink Compositions Comprising Gold And Methods For Making The Same"), each of which is incorporated by reference herein in its entirety.

As used herein, the terms "conductive ink composition", "conductive ink", "ink composition", "ink", or variations thereof, can be used interchangeably. In some embodiments, the only conductive material in an ink composition used to prepare the conductive materials of the instant disclosure is a single metal, for example silver metal. In some embodiments, multiple conductive materials are included in the conductive inks used to prepare the instant conductive materials; for example, palladium can be used as a stabilizing additive in a conductive ink based on another metal such as silver. In some embodiments, palladium is used as the main conductive material and one or more additional conductive materials can be added for desired characteristics.

It should also be understood that the conductive ink compositions used to prepare the conductive materials disclosed herein may include additional components, for example non-conductive components, to improve the properties of the ink or the properties of the conductive material prepared using the ink. For example, the conductive ink composition may include a binder or other adhesion promoter to facilitate binding and/or adhesion of the conductive material to the substrate material, for example to a specific surface, fabric, or fiber. Alternatively, or in addition, the conductive ink composition may include one or more wetting agents, detergents, or other surface agents suitable for improving the surface properties of the treated material.

As is described in detail herein, the electrically conductive materials of the instant disclosure comprise a substrate material, such as a textile substrate material or other suitable porous or semi-porous material, and a metal embedded in the substrate material. In these materials, the metal is embedded below the surface of the material. Preferably, the substrate material of the electrically conductive material is a material capable of absorbing a metal complex conductive ink composition. As would be understood by those of ordinary skill in the art, such materials can be treated with a particle-free metal complex ink composition, for example by dyeing, printing, soaking, or any other appropriate method, and the ink composition will thereby infiltrate the substrate material. Upon curing of the ink, as described in detail in the above-listed references, the treated substrate material thus becomes an electrically conductive material with the metal, ideally a pure metal or combination of metals, embedded below the surface of the material.

Suitable substrate materials for use in the instant electrically conductive materials include, for example, textile materials, such as a fabric, a fiber, a yarn, or a thread. In some embodiments, the fabric, the fiber, the yarn, or the thread comprises a polyester, a polyether-polyurea copolymer (e.g., "lycra" or "spandex"), a nylon, an acrylic, a modified cellulose (e.g., "rayon"), a polyvinyl alcohol, a polyvinyl chloride, a polyurethane, a cotton, a wool, a linen, or a silk material. Other textile substrate materials may also find utility in the instant electrically conductive materials of the disclosure, as would be understood by those of ordinary skill in the art.

In some embodiments, the substrate material is a suitable porous, or at least semiporous, natural or synthetic material, for example a thermoplastic polyurethane, a polyvinyl acetate, a nylon, a polyester, or a polyester with a further coating, such as a fluorinated coating. These materials can, for example, be provided as two-dimensional materials suitable for printing or other appropriate coating by a suitable conductive ink composition, as described herein. For example, the substrate material may be provided as a two-dimensional sheet material.

One of the advantages of the electrically conductive materials disclosed herein is that the materials can comprise a heat-degradable material that would ordinarily be damaged by the methods typically used to prepare electrically conductive textile materials (e.g., materials prepared by depositing pure metals at high temperatures). Accordingly, in some embodiments, the substrate material is a heat-degradable substrate. More specifically, the substrate material can be degradable at temperatures above about 100° C., above about 150° C., above about 200° C., above about 250° C., or above about 300° C.

It should be understood that the term "metal", as used herein, can include both a single metal as well as a combination of more than one metals. Preferably the metals of the electrically conductive materials are in their elemental forms. Ideally, the metals are highly pure metals, for example at least about 90% pure, at least about 95% pure, at least about 98% pure, at least about 99% pure, or even more pure metals. The particle-free metal complex conductive inks described in the above-listed patent references are ideally suited for the generation of such metals in an electrically conductive form.

The electrically conductive materials of the instant disclosure preferably display various desirable electrical and mechanical properties. Specifically, in some embodiments, the materials display a low electrical resistance. Furthermore, the low electrical resistance is preferably maintained even when the material is subject to stretching or straining, including stretching or straining that is repeated multiple times, even many multiple times.

For example, in some embodiments, the electrically conductive materials display an electrical resistance of about 1,000 ohms or less, of about 500 ohms or less, of about 300 ohms or less, of about 100 ohms or less, of about 50 ohms or less, of about 30 ohms or less, of about 20 ohms or less, of about 10 ohms or less, or even lower resistance. In particular, some of the electrically conductive materials display an electrical resistance of about 1 ohm or less.

In some embodiments, the electrically conductive materials display low electrical resistance even after being stretched by significant amounts, including stretching ranging from 1 to 1000%. In some embodiments, the electrically conductive materials display low electrical resistance even after being stretched up to about 20%, up to about 40%, up to about 100%, or even more. In some embodiments, the electrically conductive materials display low electrical resistance even after being stretched at least about 10%, at least about 20%, at least about 30%, at least about 50%, or even more.

In specific embodiments, the electrically conductive materials display electrical resistance of about 1,000 ohms or less, of about 100 ohms or less, of about 50 ohms or less, of about 20 ohms or less, of about 10 ohms or less, of about 5 ohms or less, of about 2 ohms or less, or even about 1 ohm or less after being stretched by at least about 10%. In some embodiments these low levels of electrical resistance are observed in conductive materials that have been stretched up to about 20%, up to about 40%, up to about 100%, and even more.

Ideally, the electrically conductive materials display low electrical resistance after being stretched for many cycles. For example, the materials can display low electrical resistance after being stretched for at least about 100 cycles, for at least about 200 cycles, for at least about 500 cycles, for at least about 1000 cycles, for at least about 2000 cycles, for at least about 5000 cycles, for at least about 10000 cycles, or for even more cycles. In some embodiments, the electrically conductive materials display electrical resistance of about 1,000 ohms or less or of about 100 ohms or less after being stretched by at least about 10% for at least about 100 cycles.

In some embodiments, the metal embedded in the textile substrate material of the instant electrically conductive materials is embedded into and below the surface of the material at a tunable depth. For example, in some embodiments the metal may be embedded at a depth from the surface of at least about 0.1 microns, at least about 0.3 microns, at least about 0.5 microns, at least about 1 micron, at least about 2 microns, or even deeper.

In some embodiments, the tunable depth may be expressed as a percentage of the cross-section of the conductive material. For example, if the conductive material has a cross-section of 20 microns, and the metal is embedded to a depth of 2 microns, those of ordinary skill in the art would understand that the metal is embedded to a depth of about 10% of the cross-section. Accordingly, in some embodiments the metal may be embedded to a depth of about 0.1%, 0.3%, 0.5%, 1%, 3%, 5%, 10%, or even deeper.

It should also be understood that, in some embodiments, the conductive materials provided herein have antimicrobial properties. Without intending to be bound by theory, such properties are believed to arise due to the release of metal ions, for example silver ions, as the material is being used. The conductive materials of the instant disclosure will likewise inherently release metals, including metal ions, as they are used, and they will thus also display antimicrobial properties. Commercial examples of antimicrobial metal-containing materials and treatments, for example Silvadur™, Silpure, and Agiene® Micro Silver Crystal technologies, are known and understood in the art.

Methods of Preparing Electrically Conductive Materials

In another aspect, the disclosure provides methods of preparing the electrically conductive materials described herein. These materials may be prepared by any suitable method, as would be understood by those of ordinary skill in the art. In some embodiments, the methods used to prepare such materials comprise providing a substrate material, for example a textile substrate material, treating the substrate material with a metal complex conductive ink composition, and curing the treated substrate material to generate a metal embedded in the substrate material. Preferably the substrate material of these methods is a material capable of absorbing a particle-free metal complex ink composition, such as the ink compositions described above.

In some embodiments, the substrate material of the instant methods is a heat-degradable material. More specifically, the substrate material is degradable at temperatures above about 100° C., above about 150° C., above about 200° C., above about 250° C., above about 300° C., or above even higher temperatures.

Suitable substrate materials for use in the instant methods of preparation include, for example, a textile substrate material, such as a fabric, a fiber, a yarn, or a thread. In some embodiments, the fabric, the fiber, the yarn, or the thread comprises a polyester, a polyether-polyurea copolymer (e.g., "lycra" or "spandex"), a nylon, an acrylic, a modified cellulose (e.g., "rayon"), a polyvinyl alcohol, a polyvinyl chloride, a polyurethane, a cotton, a wool, a linen, or a silk material. Other suitable substrate materials, including other textile substrate materials, may also find utility in the methods of the disclosure, as would be understood by those of ordinary skill in the art.

The particle-free conductive ink compositions used in the instant methods can be any suitable particle-free conductive ink composition. Exemplary ink compositions suitable for the instant methods are described in PCT International Publication No. WO2015/160938A1, PCT International Publication No. WO2018/118460A1, PCT International Publication No. WO2019/028435A1, PCT International Publication No. WO2019/028436A1, U.S. Patent Application No. 62/540,829, and U.S. Patent Application No. 62/540,903.

In preferred method embodiments, the particle-free conductive ink composition comprises silver, copper, gold, palladium, or platinum. More preferably the particle-free conductive ink composition comprises silver. In some embodiments, the particle-free conductive ink composition comprises a combination of metals, including a combination of silver, copper, gold, palladium, or platinum.

As described in detail in the Examples section, the substrate materials used in the instant methods can be treated with a metal complex conductive ink composition by various methods. In some embodiments, the substrate materials are treated with the metal complex conductive ink compositions by dyeing. In other embodiments, the substrate materials are treated with the metal complex conductive ink compositions by printing. In specific embodiments, the substrate materials are treated with the metal complex conductive ink compositions by printing multiple times, for example at least two times, at least five times, at least 10 times, or even more. As would be understood by those of ordinary skill in the art, treatment of a substrate material by multiple printing steps can increase the amount of metal embedded in the material and thus decrease the electrical resistance of the treated material.

As described above, the methods of the instant disclosure can advantageously be performed at relatively low temperatures, because the metal complex ink compositions used in these methods are converted to elemental metals by curing at relatively low temperatures. The use of low temperatures in these methods thus enables the use of even heat-degradable substrate materials in these methods. Accordingly in some embodiments of the disclosed methods, the curing step is performed at no more than about 300° C., at no more than about 250° C., at no more than about 200° C., at no more than about 150° C., at no more than about 100° C., or at no more than even lower temperatures.

The time of the curing step can advantageously also be varied to optimize outcomes, as would be understood by those skilled in the art. In particular, the curing step may be performed for no more than about 120 minutes, for no more than about 60 minutes, for no more than about 30 minutes, for no more than about 20 minutes, or for even shorter times.

In another aspect, the disclosure provides an electrically conductive material, wherein the material is prepared by any of the treatments described herein, including those methods described above, and in the Examples.

In yet another aspect are provided materials and methods, as described in the following numbered paragraphs:

1. An electrically conductive material comprising:
 a textile substrate material; and
 a metal embedded in the textile substrate material;
wherein the metal is embedded into and below the surface of the material.

2. The electrically conductive material of paragraph 1, wherein the textile substrate material is a fabric, a fiber, a yarn, or a thread.

3. The electrically conductive material of paragraph 2, wherein the fabric, the fiber, the yarn, or the thread comprises a polyester, a polyether-polyurea copolymer, a nylon, an acrylic, a modified cellulose, a polyvinyl alcohol, a polyvinyl chloride, a polyurethane, a cotton, a wool, a linen, or a silk material.

4. The electrically conductive material of paragraph 1, wherein the textile substrate material is a heat-degradable textile substrate material.

5. The electrically conductive material of paragraph 4, wherein the textile substrate material is degradable at temperatures above about 300° C.

6. The electrically conductive material of paragraph 1, wherein the metal comprises silver, copper, gold, palladium, platinum, or alloys or combinations of any of these metals.

7. The electrically conductive material of paragraph 6, wherein the metal comprises an alloy or combination of silver, copper, gold, palladium, or platinum.

8. The electrically conductive material of paragraph 6, wherein the metal comprises silver.

9. An electrically conductive material, wherein the material is prepared by the treatment of a textile substrate material with a metal complex conductive ink composition.

10. The electrically conductive material of paragraph 9, wherein the textile substrate material is a fabric, a fiber, a yarn, or a thread.

11. The electrically conductive material of paragraph 10, wherein the fabric, the fiber, the yarn, or the thread comprises a polyester, a polyether-polyurea copolymer, a nylon, an acrylic, a modified cellulose, a polyvinyl alcohol, a polyvinyl chloride, a polyurethane, a cotton, a wool, a linen, or a silk material.

12. The electrically conductive material of paragraph 9, wherein the textile substrate material is a heat-degradable material.

13. The electrically conductive material of paragraph 12, wherein the textile substrate material is degradable at temperatures above about 300° C.

14. The electrically conductive material of paragraph 9, wherein the metal complex conductive ink composition comprises silver, copper, gold, palladium, or platinum.

15. The electrically conductive material of paragraph 14, wherein the metal complex conductive ink composition comprises a combination of silver, copper, gold, palladium, or platinum.

16. The electrically conductive material of paragraph 14, wherein the metal complex conductive ink composition comprises silver.

17. The electrically conductive material of paragraph 9, wherein the treatment is performed at a temperature of 300° C. or lower.

18. The electrically conductive material of paragraph 9, wherein the textile substrate material is treated with the metal complex conductive ink composition by dyeing.

19. The electrically conductive material of paragraph 9, wherein the textile substrate material is treated with the metal complex conductive ink composition by printing.

20. The electrically conductive material of any one of paragraphs 1-19, wherein the material displays an electrical resistance of about 1,000 ohms or less after being stretched by at least about 10%.

21. The electrically conductive material of paragraph 20, wherein the material displays an electrical resistance of about 1,000 ohms or less after being stretched by at least about 10% for at least about 100 cycles.

22. A method of preparing an electrically conductive material, comprising:
 providing a textile substrate material;
 treating the textile substrate material with a metal complex conductive ink composition; and
 curing the treated substrate material to generate a metal embedded in the substrate material.

23. The method of paragraph 22, wherein the textile substrate material is a fabric, a fiber, a yarn, or a thread.

24. The method of paragraph 23, wherein the fabric, the fiber, the yarn, or the thread comprises a polyester, a polyether-polyurea copolymer, a nylon, an acrylic, a modified cellulose, a polyvinyl alcohol, a polyvinyl chloride, a polyurethane, a cotton, a wool, a linen, or a silk material.

25. The method of paragraph 22, wherein the textile substrate material is a heat-degradable material.

26. The method of paragraph 25, wherein the textile substrate material is degradable at temperatures above about 300° C.

27. The method of paragraph 22, wherein the metal complex conductive ink composition comprises silver, copper, gold, palladium, or platinum.

28. The method of paragraph 27, wherein the metal complex conductive ink composition comprises a combination of silver, copper, gold, palladium, or platinum.

29. The method of paragraph 27, wherein the metal complex conductive ink composition comprises silver.

30. The method of paragraph 22, wherein the textile substrate material is treated with the metal complex conductive ink composition by dyeing.

31. The method of paragraph 22, wherein the textile substrate material is treated with the metal complex conductive ink composition by printing.

32. The method of paragraph 22, wherein the textile substrate material is treated with the metal complex conductive ink composition at least two times.

33. The method of paragraph 22, wherein the curing step is performed at no more than about 300° C.

34. The method of paragraph 22, wherein the curing step is performed for no more than about 120 minutes.

It will be readily apparent to one of ordinary skill in the relevant arts that other suitable modifications and adaptations to the methods and applications described herein can be made without departing from the scope of the invention or any embodiment thereof. Having now described the present invention in detail, the same will be more clearly understood by reference to the following Examples, which are included herewith for purposes of illustration only and are not intended to be limiting of the invention.

EXAMPLES

Example 1. Printing on Fabrics

In a typical example, a silver complex ink of suitable rheological properties is screen/stencil printed, dispensed, written with a writing utensil such as pen or marker, or inkjet-printed onto fabric to form an electrically conductive pathway. The solid contents of the ink typically range from about 6% to 50%. Upon printing, the ink soaks into the fabric and is then cured in an ambient atmosphere at temperatures below 150° C. for less than 30 minutes (typically at 140° C. or 100° C. for 20 minutes). Multiple-pass printing over the same area (e.g., the area corresponding to the desired conductive pathway) may be required depending upon porosity/absorbency of the fabric. Typical fabrics may be woven, non-woven, knitted, or natural products like cotton, silk, wool, or linen. Synthetic fabrics include nylon, polyester, polyether-polyurea copolymers (e.g., "lycra" or "spandex"), acrylic, modified cellulose (e.g., rayon), acetate, urethane, and the like. The electrical resistance of the resultant conductive fabrics can vary depending upon conditions, but typically will be within the range of 5% to 70% of the resistance of the bulk metal, for example bulk silver.

Figure 3:
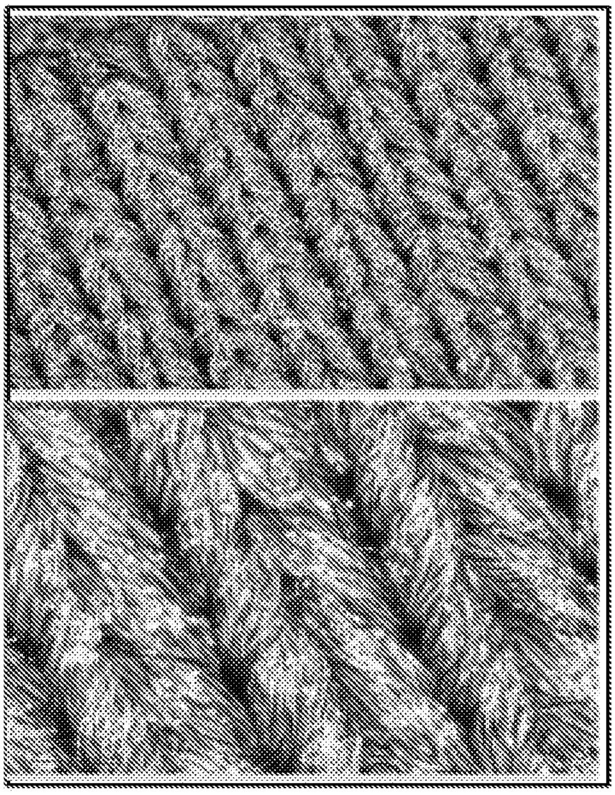
FIG. 3. Microscopic images of fabric prepared by screen printing or dyeing.

Microscopic images (at two magnifications) of an exemplary conductive printed fabric prepared according to the above methods is illustrated in FIG. 3. As shown in this image, the grainy fidelity and morphology of the underlying textile substrate remains intact after the metallization process, indicating that the metal has become embedded in the conductive fabric Such a morphology is distinct from what would be expected for a fabric metallized by a traditional process, where a metal trace sitting on top of the fabric would be expected.

Figure 4A:
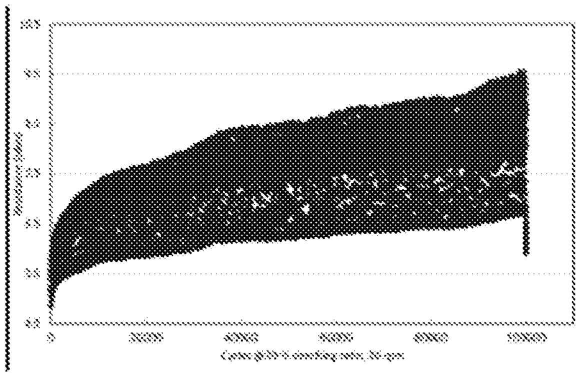
FIG. 4A. Resistance vs. stretching cycles for a printed conductive fabric prepared according to the disclosure.
Figure 4B:
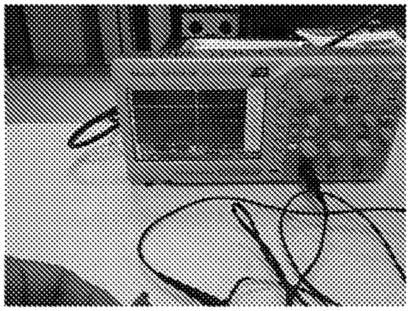
FIG. 4B. Photograph of instrument used to measure resistance vs. stretching.
Figure 4C:
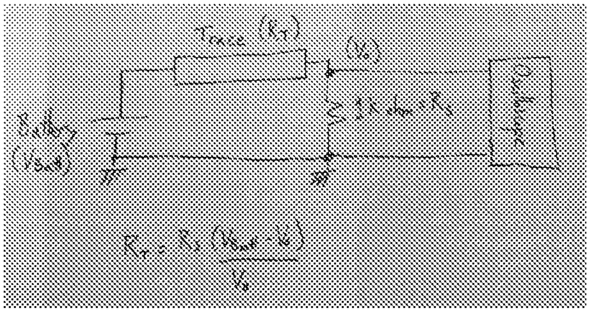
FIG. 4C. Circuit diagram of the electronic components used to measure resistance vs. stretching.

FIG. 4A illustrates typical stretch-test cycle data for a conductive fabric prepared by screen printing as described above using the instrument shown in FIG. 4B and the circuit diagram shown in FIG. 4C. In this example, the fabric was stretched at a 20% stretching ratio at 20 cycles per minute. The resistance of the fabric remains below 10 ohms even after 100,000 cycles.

Figure 5A:
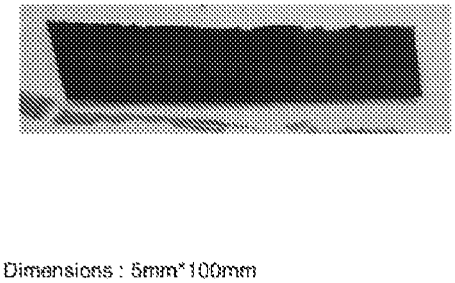
FIG. 5A. Photographic image of a conductive screen-printed polyester fabric.
Figure 5B:
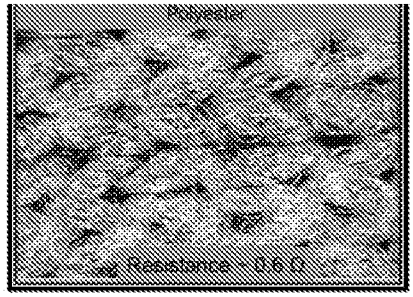
FIG. 5B. Microscopic image of a conductive screen-printed polyester fabric.

Another example of a screen-printed conductive trace on a polyester fabric is described in Table 1 below. The physical and morphological properties of this fabric are illustrated in FIGS. 5A-5B. The conductive fabric, which was cured at 55° C. to 120° C. for 20 minutes, displays less than 1 ohm resistance before and after stretching (Table 1). Macroscopic (FIG. 5A) and microscopic (FIG. 5B) images of the conductive fabric highlight the normal fabric morphology after metallization.

TABLE 1

| Screen Printed Sample | | | | | | | |
|---|---|---|---|---|---|---|---|
| Sample ID | Substrate | Ink | Printing method | Curing conditions | Resistance before stretching | Resistance after stretching | Dimensions |
| 03082018-8 | Polyester fabric | El-302 | Screen printing | 55° C. to 120° C., 20 minutes in oven | <1 Ω | <1 Ω | 5 mm × 100 mm |

Example 2. Dyeing on Fabrics

In a typical example, a silver complex ink of suitable rheological properties is contained in a vessel. A piece of fabric is "soaked" or "dip-coated" in the ink within the vessel. Typical coating times are on the order of 1 second to 60 minutes, depending on the fabric type. Furthermore, pre-swelling of the fabric can sometimes facilitate better infiltration of the metal complex ink into the fabric. Pre-swelling is typically accomplished by exposure of the fabric to a suitable liquid/solvent, in some cases at elevated temperatures (e.g., 60° C. to 100° C.), or a combination of both. Once saturated, or "dyed", the fabric is removed and cured in ambient at temperatures below 150° C. for less than 30 minutes (typically 140° C. or 100° C. for 20 minutes). The solid contents of the ink typically ranges from about 6% to 30%. A typical fabric may be a woven or non-woven knitted natural product like cotton, silk, wool, or linen. A synthetic fabric may be nylon, polyester, polyether-polyurea copolymers (e.g., "lycra" or "spandex"), acrylic, modified cellulose (e.g., rayon), acetate, urethane. The electrical resistance varies depending upon conditions, but typically will be within the range of 5% to 70% of bulk Ag.

Figure 6:
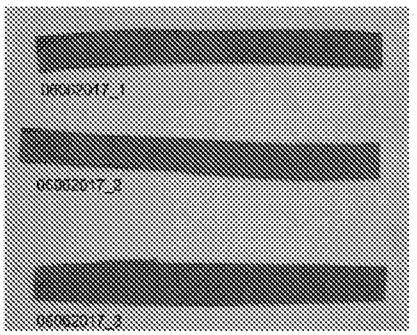
FIG. 6. Illustration of a conductive polyether-polyurea copolymer (i.e., lycra) prepared according to the disclosure.

Exemplary conductive dyed fabrics prepared according to the above methods are illustrated in FIGS. 3, 5A, 5B, and 6. The fabrics shown in FIG. 6 are further described in Table 2 below.

TABLE 2

| Dyed Fabric Samples | | | | |
|---|---|---|---|---|
| Sample ID | Substrate/Textile | Coating method | Resistance | Approximate Dimensions |
| 06062017_1 | 84% Polyester and 16% Elasthane Fabric | Dyeing | 1.1 Ω | 1.5 cm × 12 cm |
| 06062017_2 | 84% Polyester and 16% Elasthane Fabric | Dyeing | 0.9 Ω | 1.5 cm × 12 cm |
| 06062017_3 | 84% Polyester and 16% Elasthane Fabric | Dyeing | 0.7 Ω | 1.5 cm × 12 cm |

Example 3. Dyeing on Fibers or Yarns

In a typical example, a silver complex ink of suitable rheological properties is contained in a vessel. A piece of fiber or yarn, or multiple fiber/yarn pieces wound together, is "soaked" or "dip-coated" in the ink within the vessel. Typical coating time is on the order of 1 second to 60 minutes depending upon the fiber or yarn type. Furthermore, pre-swelling of the fiber or yarn is sometimes allowed to take place to better enable infiltrating of the metal complex ink into the fiber or yarn. Pre-swelling is typically accomplished by exposure of the fiber or yarn to a suitable liquid/solvent, in some cases at elevated temperatures (e.g., 60° C. to 100° C.), or a combination of both. Once saturated, or "dyed", the fiber or yarn is removed and cured in ambient at temperatures below 150° C. for less than 30 minutes (typically 140° C. or 100° C. for 20 minutes). The solid contents of the ink typically ranges from about 6% to 30%. The electrical resistance varies depending upon conditions, but typically will be within the range of 5% to 70% of bulk Ag.

Figure 7:
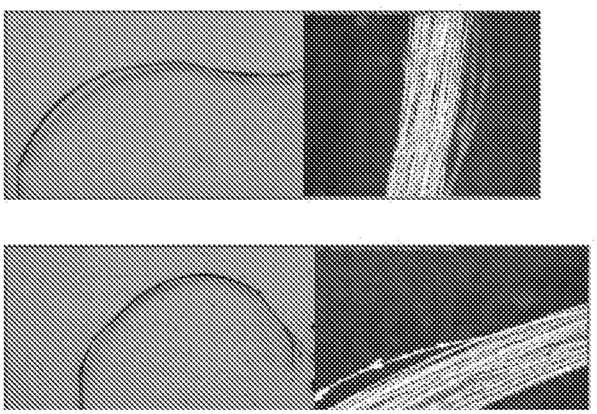
FIG. 7. Comparison of conductive aramid fibers and yarns dyed according to the methods of the disclosure.

Exemplary conductive dyed fibers prepared according to the above methods are illustrated in FIG. 7 and are further described in Table 3 below.

TABLE 3

| Dyed Fiber Samples | | | | | | |
|---|---|---|---|---|---|---|
| Sample ID | Substrate/Textile | Coating Method | Jak | Dimensions | Curing | Resistance |
| 083117-16 | Aramid Fiber | Dyeing | ARX II | ~3-4 cm long | 150° C. for 1 hour (oven) | <5 Ω |

Example 4. Conductive Materials Prepared by Various Printing Methods

Figure 8:
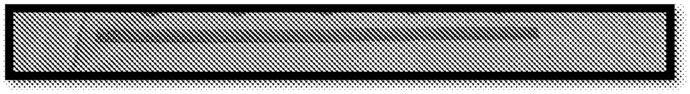
FIG. 8. Photographic images of additional conductive materials prepared by various printing methods.
Figure 8:
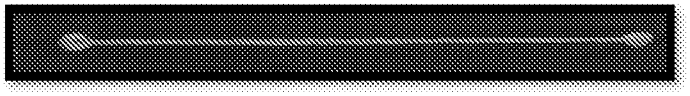
Figure 8:
Figure 8:
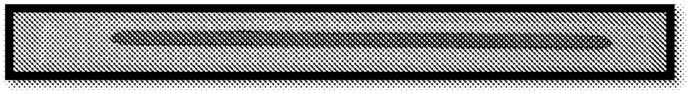
Figure 8:
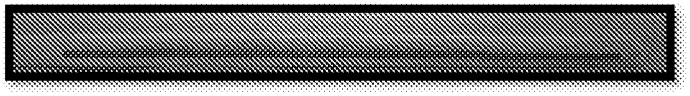
Figure 8:
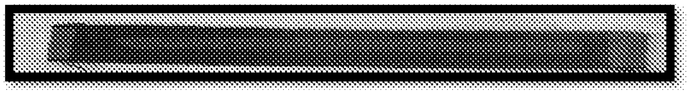
Figure 8:
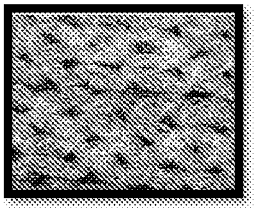
Figure 8:
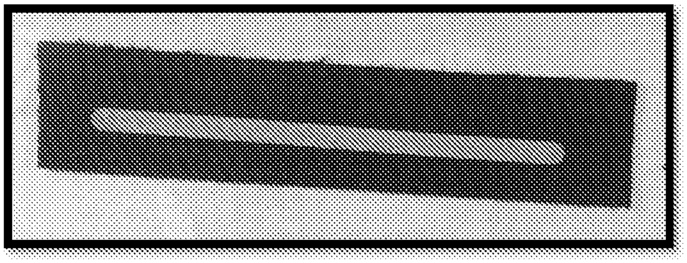

Exemplary conductive materials prepared by inkjet or screen printing methods are described in Table 4 below and are illustrated in the images shown in FIG. 8.

TABLE 4

| Samples Prepared by Printing | | | | | | | | | | |
|---|---|---|---|---|---|---|---|---|---|---|
| Sample ID | Material | Architecture | Stretch-ability | Printing Method | Ink | Curing Temperature | 2 pt Resistance | After stretching | Silver trace dimensions | Stretching ratio |
| A1 | Thermoplastic Polyurethane | Plastic sheet | Yes | Inkjet | El-002 | 55° C. | 40 Ω | 50 Ω | 3 mm x 100 mm | |
| B1 | Polyvinyl acetate | Plastic sheet | Yes | Inkjet | El-002 | 140° C. | 6.6 Ω | 7.60 Ω (after folding) | 3 mm x 100 mm | |
| C1 | Polyvinyl acetate | Plastic sheet | Yes | Screen Printing | A354 | 140° C. | 75 Ω | 265 Ω | 3 mm x 100 mm | |
| D1 | Polyurethane | Plastic sheet | Yes | Inkjet | El-015 | 55° C. | 20 Ω | OL | 5 mm x 100 mm | |
| E1 | Nylon | Textile | No | Screen Printing | El-306 | 140° C. | 35 Ω | OL | 5 mm x 100 mm | |
| F1 | Polyester | Composite (plastic on textile) | Yes | Inkjet | A283 | 140° C. | 4 Ω | 12 Ω | 3 mm x 100 mm | |
| G1 | Polyester | Composite (plastic on textile) | Yes | Screen Printing | A402 | 140° C. | 220 Ω | 380 Ω | 1 mm x 100 mm | 25% |
| H1 | Polyester | Textile | Yes | Screen Printing | El-302 | 120° C. | <1 Ω | <1 Ω | 5 mm x 100 mm | <10% |
| I1 | Polyester with fluorinated coating | Textile | No | Screen Printing | El-306 | 140° C. | 10 Ω | — | 5 mm x 100 mm | |

Example 5. Conductive Materials Prepared by Dyeing of Fabric

Figure 9:
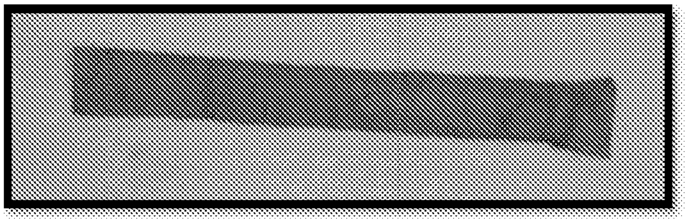
FIG. 9. Photographic images of additional conductive materials prepared by the dyeing of fabrics.
Figure 9:
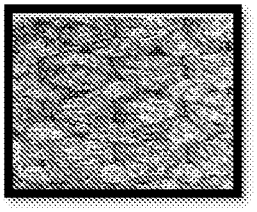
Figure 9:
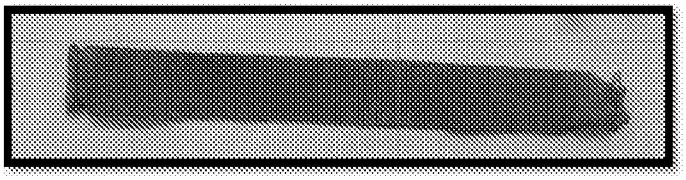
Figure 9:
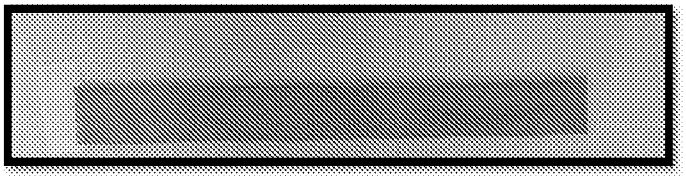
Figure 9:
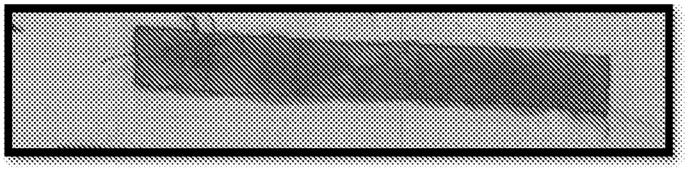
Figure 9:
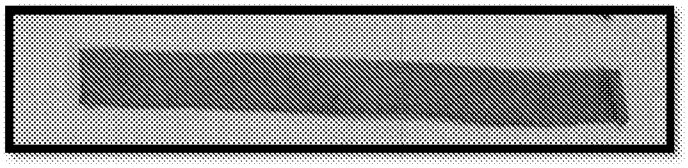

Additional conductive materials prepared by dyeing of fabrics are described in Table 5 below and are illustrated in the images shown in FIG. 9.

TABLE 5

| Additional Samples Prepared by Dyeing of Fabrics | | | | | | | | | |
|---|---|---|---|---|---|---|---|---|---|
| Sample ID | Textile | Stretch-ability | Ink | Dyeing | Curing Method | 2 pt Resistance | After stretching | Silver trace dimensions | Stretching ratio |
| A2 | 84% Polyester + 16% Elastane | Yes | El-002 | Overnight soaking | Overnight air dry and then 60 ° C. overnight oven dry | 3.3 Ω | 12 Ω | 12 mm x 120 mm | <75% |
| B2 | | Yes | El-002 | overnight 2 soaking | Overnight air dry and then 60 ° C. overnight oven dry | 4.8 Ω | 26 Ω | 12 mm x 120 mm | |

TABLE 5-continued

Additional Samples Prepared by Dyeing of Fabrics

| Sample ID | Textile | Stretch-ability | Ink | Dyeing | Curing Method | 2 pt Resistance | After stretching | Silver trace dimensions | Stretching ratio |
|---|---|---|---|---|---|---|---|---|---|
| C2 | Rain coat material | No | El-702 | 2 overnight soaking | Overnight air dry and then 60 ° C. overnight oven dry | <0.3 Ω | 50 Ω | 12 mm x 120 mm | |
| D2 | 100% Kona Cotton | No | El-002 | 2 overnight soaking | Overnight air dry and then 60 ° C. overnight oven dry | <5 Ω | OL | 12 mm x 120 mm | |
| E2 | Mossimo (50% polyester, 38% cotton, 12% rayon) | Yes | El-002 | 2 overnight soaking | Overnight air dry and then 60 ° C. overnight oven dry | <1 Ω | 30 Ω | 12 mm x 120 mm | |

Example 6. Conductive Materials Prepared by Dyeing of Fibers

Figure 10:
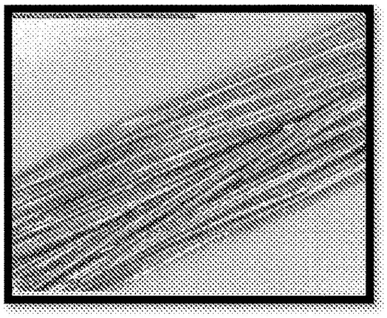
FIG. 10. Photographic images of additional conductive materials prepared by the dyeing of fibers.
Figure 10:
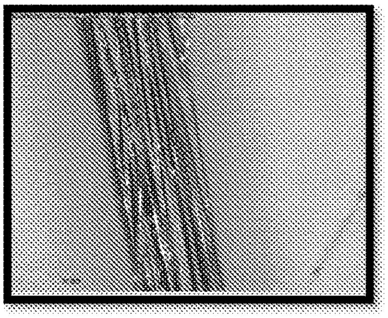
Figure 10:
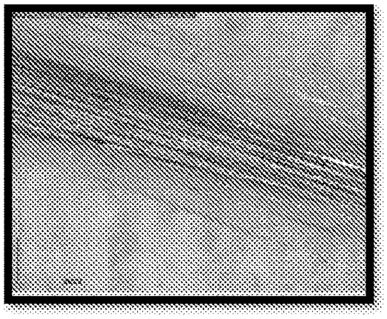
Figure 10:
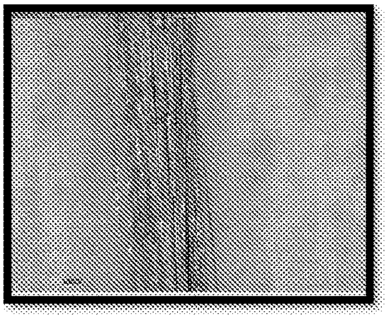

Additional conductive materials prepared by dyeing of fibers are described in Table 6 below and are illustrated in the images shown in FIG. 10.

TABLE 6

Additional Samples Prepared by Dyeing of Fibers

| Sample ID | Fibers | Ink | Curing temperature | Resistance |
|---|---|---|---|---|
| A3 | Polyester Yarn | A892 | 120° C. | 27.5 Ω |
| B3 | Polyester filament | El-002 | 100° C. | 1.6 Ω |
| C3 | Silk | El-014 | 140° C. | 100 Ω |
| D3 | Aramid Fibers | El-009 | 150° C. | 5 Ω |

In all of the above examples, the metal complex ink compositions may additionally contain a binder or adhesion promoter to facilitate adhesion to a specific fabric or fiber.

In all of the above examples, besides the advantageous electrical and mechanical (i.e., stretchable) properties of the conductive materials, the conductive materials that have been modified with a pure silver film, for example by treatment with a silver-complex ink composition, are also intrinsically antimicrobial.

In all of the above examples, resistance is typically measured by a two point resistance measurement over 10 cm.

All patents, patent publications, and other published references mentioned herein are hereby incorporated by reference in their entireties as if each had been individually and specifically incorporated by reference herein.

While specific examples have been provided, the above description is illustrative and not restrictive. Any one or more of the features of the previously described embodiments can be combined in any manner with one or more features of any other embodiments in the present invention. Furthermore, many variations of the invention will become apparent to those skilled in the art upon review of the specification. The scope of the invention should, therefore, be determined by reference to the appended claims, along with their full scope of equivalents.

What is claimed is:

1. An electrically conductive material, wherein the electrically conductive material is prepared by treating a textile substrate material with a particle-free silver complex conductive ink composition and curing the silver complex conductive ink composition at a temperature of no more than about 150° C. to generate a silver metal embedded into and below the surface of the textile substrate material, wherein the electrically conductive material displays an electrical resistance of about 1,000 ohms or less after being stretched by at least about 10% as measured by a two point resistance measurement over 10 cm.

2. The electrically conductive material of claim 1, wherein the textile substrate material is a fabric, a fiber, a yarn, or a thread.

3. The electrically conductive material of claim 2, wherein the fabric, the fiber, the yarn, or the thread comprises a polyester, a polyether-polyurea copolymer, a nylon, an acrylic, a modified cellulose, a polyvinyl alcohol, a polyvinyl chloride, a polyurethane, a cotton, a wool, a linen, or a silk material.

4. The electrically conductive material of claim 1, wherein the textile substrate material is a heat-degradable material.

5. The electrically conductive material of claim 4, wherein the textile substrate material is degradable at temperatures above about 300° C.

6. The electrically conductive material of claim 1, wherein the textile substrate material is treated with the silver complex conductive ink composition by dyeing.

7. The electrically conductive material of claim 1, wherein the textile substrate material is treated with the silver complex conductive ink composition by printing.

8. The electrically conductive material of claim 1, wherein the electrically conductive material displays an electrical resistance of about 1,000 ohms or less after being stretched by at least about 10% for at least about 100 cycles as measured by a two point resistance measurement over 10 cm.

9. The electrically conductive material of claim 1, wherein the particle-free silver complex conductive ink composition further comprises copper, gold, palladium, or platinum.

* * * * *